United States Patent
Miya et al.

(10) Patent No.: US 6,866,744 B2
(45) Date of Patent: Mar. 15, 2005

(54) SEMICONDUCTOR PROCESSING APPARATUS AND A DIAGNOSIS METHOD THEREFOR

(75) Inventors: Go Miya, Chiyoda (JP); Junichi Tanaka, Tsuchiura (JP); Tsutomu Tetsuka, Chiyoda (JP); Hideyuki Yamamoto, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 56 days.

(21) Appl. No.: 10/229,072

(22) Filed: Aug. 28, 2002

(65) Prior Publication Data

US 2003/0205326 A1 Nov. 6, 2003

(30) Foreign Application Priority Data

May 2, 2002 (JP) ........................................ 2002-130793

(51) Int. Cl.[7] .......................... H05H 1/00; C23C 16/00; B08B 3/12
(52) U.S. Cl. ........................ 156/345.24; 118/712; 134/1
(58) Field of Search ...................... 156/345.24, 345.25; 118/712, 715; 216/59; 134/1, 1.1, 1.2, 1.3

(56) References Cited

U.S. PATENT DOCUMENTS

| 5,387,777 | A | * | 2/1995 | Bennett et al. | ........ | 219/121.43 |
| 5,795,399 | A | * | 8/1998 | Hasegawa et al. | ........... | 134/1.3 |
| 6,214,706 | B1 | * | 4/2001 | Madan et al. | ................ | 438/482 |
| 6,427,622 | B2 | * | 8/2002 | Madan et al. | ......... | 118/723 HC |

FOREIGN PATENT DOCUMENTS

| JP | 58200539 A | * | 11/1983 | ......... | H01L/21/302 |
| JP | 06275578 A | * | 9/1994 | ......... | H01L/21/302 |

* cited by examiner

*Primary Examiner*—Parviz Hassanzadeh
(74) *Attorney, Agent, or Firm*—Antonelli, Terry, Stout & Kraus, LLP

(57) ABSTRACT

A semiconductor processing apparatus for applying plasma treatment to a sample arranged in a vacuum process chamber includes a plasma generator for generating plasma inside the vacuum process chamber and a process gas supply for introducing a process gas into the vacuum process chamber. The apparatus further includes an oscillator for imparting mechanical oscillation to the semiconductor processing apparatus, a receiver for detecting mechanical oscillation generated by the oscillator in the semiconductor processing apparatus as a signal, and an analyzer for analyzing the detected signal to diagnose whether the vacuum process chamber is normally assembled.

3 Claims, 16 Drawing Sheets

SEMICONDUCTOR PROCESSING APPARATUS AND A DIAGNOSIS METHOD THEREFOR

BACKGROUND OF THE INVENTION

This invention relates to a semiconductor processing apparatus and a diagnosis method for the apparatus. More particularly, the invention relates to a semiconductor processing apparatus capable of diagnosing an internal condition of a process chamber of a semiconductor processing apparatus and a diagnosis method for the apparatus.

Existing semiconductor processing apparatuses for processing a sample such as a semiconductor substrate include a plasma-etching apparatus that utilizes reactive plasma, a plasma CVD (Chemical Vapor Deposition) apparatus and a thermal CVD apparatus that conducts a film formation process by exposing a semiconductor substrate held at a temperature suitable for the treatment into a reactive gas.

In the semiconductor processing apparatuses described above, reaction products formed during processing of the semiconductor substrate are deposited to an inner wall of a process chamber. When this deposit peels off from the process chamber inner wall, it forms particles with peel and the particles so formed fall and adhere to the surface of the semiconductor substrate. When the particles adhere to the substrate surface, they invite short-circuit or disconnection of wiring of an integrated circuit fabricated on the surface of the semiconductor substrate or remains of etching. In consequence, defects of the semiconductor devices as the product and the lowering of production yield occur.

To avoid the problem, dry cleaning such as gas cleaning conducted by filling a reactive gas while the internal pressure of the process chamber of the semiconductor processing apparatus is kept vacuum or plasma cleaning that uses reactive plasma is periodically conducted to remove the reaction byproducts.

To remove the deposit that cannot be removed by dry cleaning described above, a cleaning operation (called "wet cleaning" or "manual cleaning") is carried out that releases the process chamber to open air and allows an operator to manually wipe off the inner wall of the process chamber with water or an alcohol. Besides the wiping operation of the inner wall surface of the process chamber, the wet cleaning operation also includes the steps of disassembling and taking out those components inside the process chamber that are made of metals, quartz glass or ceramics, washing the components so taken out or wiping contaminants on the surface, and again assembling the components.

Since the semiconductor processing apparatus uses the reactive gas or reactive plasma as described above, the constituent components inside the process chamber are chemically or thermally damaged and undergo wear or breakage. Therefore, the constituent components inside the process chamber have to be periodically exchanged. The constituent components reaching their service life are exchanged at the time of wet cleaning, for example.

As described above, wet cleaning involves the steps of releasing the process chamber to the atmospheric pressure, conducting the manual cleaning operation, then conducting the re-assembling operation and further conducting evacuation of the process chamber. The cleaning operation needs a long time and lowering of productivity. For these reasons, wet cleaning is conducted in, for example, an unavoidable case where dry cleaning fails to lower the number of adhering particles to the semiconductor substrate to a predetermined value.

SUMMARY OF THE INVENTION

When wet cleaning according to the existing technology described above is conducted, the process chamber is returned to the atmospheric pressure and the process chamber cover is further opened and released to open air. Therefore, a contact condition between the process chamber and the process chamber cover sometimes changes depending on the difference of a method of closing the process chamber cover when the process chamber is re-assembled after completion of wet cleaning. When the constituent components inside the process chamber are decomposed, cleaned and fitted again, the contact condition with other components sometimes changes, too. In these cases, process performance such as a film formation rate of the processing apparatus, and an etching rate or their in-plane uniformity change before and after wet cleaning. In the semiconductor processing apparatus using reactive plasma, in particular, an impedance of the process chamber changes with the change of the contact condition at the time of re-assembly. Consequently, electric characteristics of the resulting reactive plasma change before and after wet cleaning, and plasma processing performance changes.

In-plane uniformity of the semiconductor substrate typified by the change with time of the film formation rate or the etching rate must be restricted to several percents in practical mass-fabrication plants of semiconductor devices. Therefore, the change of processing performance results in the drop of the semiconductor production yield.

To cope with the change of plasma processing performance before and after wet cleaning, the following measures are generally employed. The process chamber is evacuated after wet cleaning. Next, a test semiconductor substrate called a "QC (Quality Check) substrate" is subjected to the semiconductor fabrication process. The film formation rate or the etching rate or their in-plane uniformity in this substrate is measured to evaluate processing performance. When any fault is judged as existing in the re-assembly of the process chamber, the process chamber is again released to open air and the re-assembly steps of the process chamber are checked. In this case, a long time is necessary before the re-assembly is again conducted and the drop of productivity is unavoidable. Additionally, the change of the contact condition of the constituent components inside the process chamber with other components occurs at times other than wet cleaning. For example, bolts or nuts that fix the constituent components get loose due to repetition of the temperature change of the constituent components themselves or the temperature change in the proximity of the components, or due to the pressure change inside the process chamber. As a result, the contact condition changes in some cases.

On the other hand, one of the main factors for deciding the frequency of the wet cleaning operation or its timing is the increase of the number of particles adhering to the semiconductor substrate with the increase of the reaction byproducts deposited inside the process chamber. To count the number of adhering particles, the QC substrate is processed and the number of particles adhering to the QC substrate is counted. The degree of cleanness of the process chamber is evaluated in terms of the number of adhering particles so measured. Though the measurement of the number of adhering particles is an effective means, it is difficult to completely evaluate the degree of cleanness inside the process chamber. For, there is sometimes the case where the number of particles abruptly increase and these particles adhere to the semiconductor substrate. Even when the number of particles detected by the QC substrate does not represent any problem for processing, a large number of particles thereafter adhere frequently to the surface of the semiconductor substrate for the product and invite the drop of the production yield.

JP-A-4-204039 describes a method that arranges an AE (Acoustic Emission) sensor and detects through the sensor a high frequency elastic wave that occurs when a crack develops in a film of reaction products deposited to an inner wall of a process chamber. This method is effective means for detecting the occurrence of particles through peel of a deposited film. When a crack develops in the film, however, the particles fall and adhere in most cases to the surface of the semiconductor substrate. In consequence, this method cannot detect by itself in advance the occurrence of the particles and cannot either prevent effectively the drop of the production yield.

Furthermore, the constituent components of the semiconductor processing apparatus are worn out and have to be exchanged in the course of repetition of processes. JP-A-2002-18274 discloses a technology that estimates the degree of consumption of the components that are consumed, on the basis of electric data such as a radio frequency power source of the semiconductor processing apparatus. This technology is effective for electrically conductive components made of a metal or for insulating components having a small thickness. However, semiconductor processing apparatuses using plasma are in most cases formed of insulating members having a large thickness such as quartz or ceramics, and the estimation technology using the electric data cannot easily diagnose the degree of wear.

In view of the problems described above, this invention provides a semiconductor processing apparatus capable of diagnosing a re-assembly fault of a process chamber after wet cleaning or the condition of the process chamber such as deposition of reaction byproducts and cutoff of components, and a diagnosis method for the apparatus.

To accomplish the object described above, the invention employs the following measures.

According to an aspect of the invention, there is provided a semiconductor processing apparatus for applying plasma treatment to a sample arranged inside a vacuum process chamber, including a plasma generation apparatus for generating plasma inside the vacuum process chamber and process gas introduction means for introducing a process gas into the vacuum process chamber, wherein the apparatus comprises oscillation means for imparting mechanical oscillation to the semiconductor processing apparatus and reception means for detecting mechanical oscillation generated by the oscillation means in the semiconductor processing apparatus.

Other objects, features and advantages of the invention will become apparent from the following description of the embodiments of the invention taken in conjunction with the accompanying drawings.

DESCRIPTION OF THE EMBODIMENTS

Figure 1:
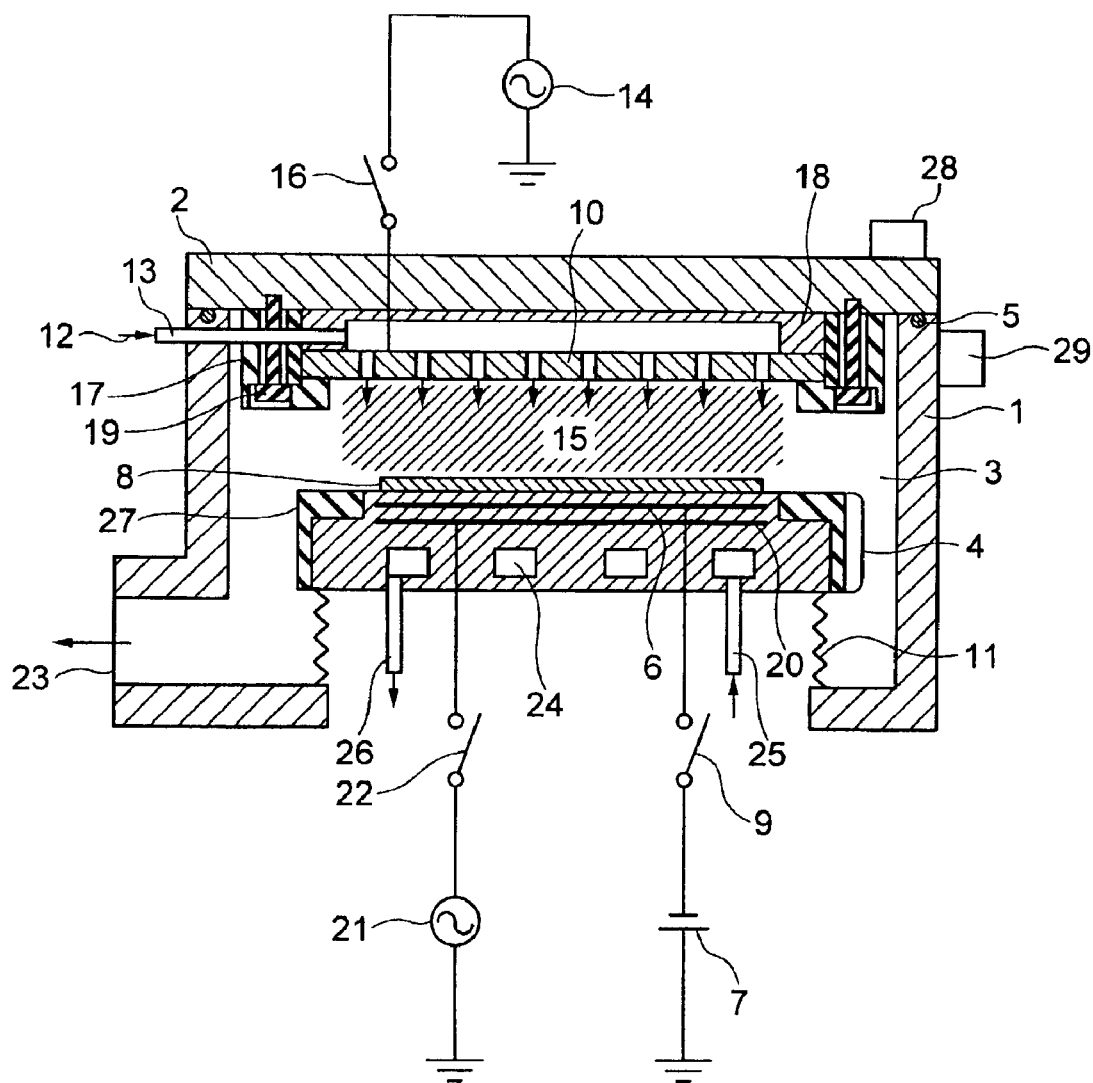
FIG. 1 is a sectional view showing a parallel plate sheet type plasma etching apparatus according to a first embodiment of the invention.

Embodiments of this invention will be hereinafter explained with reference to the accompanying drawings. FIG. 1 illustrates a parallel flat sheet type plasma etching apparatus according to a first embodiment of the invention. As shown in the drawing, a process chamber cover 2 is put on process chamber sidewalls 1 to define a process chamber 3. An electrostatic suction device 4 is installed inside the process chamber 3 thus formed. A circular groove is defined in an upper end face of the process chamber sidewalls 1 and an O-ring 5 is buried into the groove. The O-ring 5 keeps the inside of the process chamber 3 airtight.

A support surface made of an insulating material is formed at the upper part of the electrostatic suction device 4 and a suction electrode 6 is buried into the insulating material. A DC power source 7 is connected to the suction electrode 6. Electrostatic force generated between the suction electrode 6 and a semiconductor substrate 8 electrostatically sucks the semiconductor substrate 8. A switch 9 is interposed between the suction electrode 6 and the DC power source 7 to turn ON/OFF the supply of a DC power source voltage. A driving device, not shown, is connected to the electrostatic suction device 4. The distance between the semiconductor substrate 8 placed on the suction device and a shower plate is regulated so that an optimum etching process can be carried out. Bellows 11 is sandwiched between the electrostatic suction device 4 and the process chamber sidewalls 1 to keep air-tightness.

A process gas 12 flows through a pipe 13 and is introduced into the process chamber 3 through the shower plate 10 having a large number of inlets. A radio frequency power source 14 is connected to the shower plate 10 and supplies a radio frequency voltage to convert the process gas 12 to plasma 15. A switch 16 is interposed between the shower plate 10 and the radio frequency power source 14 and turns ON/OFF the application of the radio frequency voltage. Incidentally, the shower plate 10 is fixed to the process chamber cover 2 by means such as a jig 17, a plate 18 and a bolt 19.

A semiconductor fabrication process (etching process) is carried out when the semiconductor substrate 8 is exposed to plasma 15. At this time, the radio frequency power source 21 applies the radio frequency voltage to the radio frequency applying electrode 20 buried into the electrostatic suction device 4 to apply a bias potential to the electrostatic suction device 4. This bias potential entraps the ions generated in plasma into the semiconductor substrate 8 and anisotropic etching can be thus made. A switch 22 is interposed between the radio frequency applying electrode 20 and the radio frequency power source 21 to turn ON/OFF the application of the radio frequency voltage.

The process gas 12 and volatile matters created during a reaction in the semiconductor fabrication process are discharged from an exhaust port 23. A vacuum pump, not shown, is connected to the exhaust port 23 to reduce the internal pressure of the process chamber 3.

A coolant flow passage 24 is defined inside the electrostatic suction device 4. A coolant is supplied from a coolant feed port 25 through a cooling device, not shown, connected to the outside. The coolant flows through the coolant flow passage 24 and is discharged from a coolant discharge port 26, thereby cooling the electrostatic suction device 4. Heat which the semiconductor substrate 8 receives during the plasma process is transferred to the coolant flowing inside the coolant flow passage 24 through the electrostatic suction device 4. Incidentally, the cover 27 protects the electrostatic suction device 4 from plasma 15.

An ultrasonic oscillator 28 as oscillation means is arranged on the process chamber cover 2. An AE sensor 29 as reception means is arranged at the upper part of the process chamber sidewall 1. The ultrasonic oscillator 28 generates pulse-like oscillation and the AE sensor 29 detects the oscillation propagating through the process chamber cover 2 and through the process chamber sidewall 1. The process chamber cover 2 is bonded to the ultrasonic oscillator 28 through an adhesive and the process chamber sidewall 1 is likewise bonded to the AE sensor 29 through the adhesive. In other words, the adhesive fixes the ultrasonic oscillator 28 with the process chamber cover 2 and the AE sensor 29 with the process chamber sidewall 1. The adhesive also promotes contact between the process chamber cover 2 having minute concavo-convexities on the surface thereof and the ultrasonic oscillator 28 and between the process chamber sidewall 2 and the AE sensor 29. In consequence, detection accuracy of the ultrasonic wave by the AE sensor 29 can be improved. A controller and a power source, not shown, are respectively connected to the ultrasonic oscillator 28. Process means for processing reception signals, that is to be later described, is connected to the AE sensor 29.

Figure 2A:
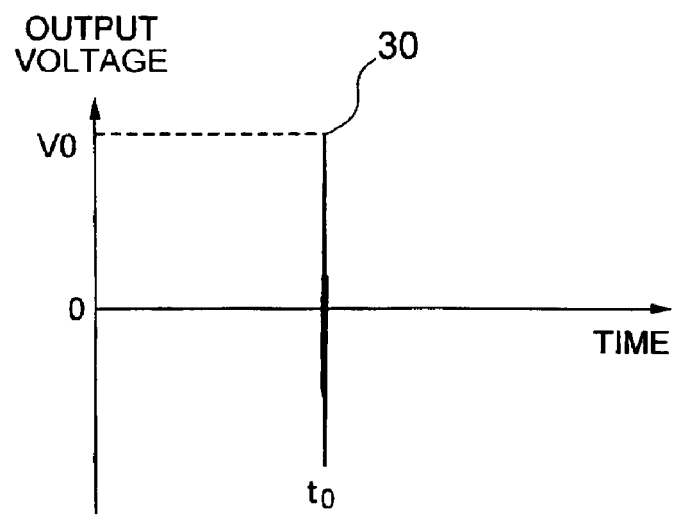
FIGS. 2A and 2B are diagrams explaining a method of diagnosing whether or not assembly in a process chamber is normally carried out.
Figure 2B:
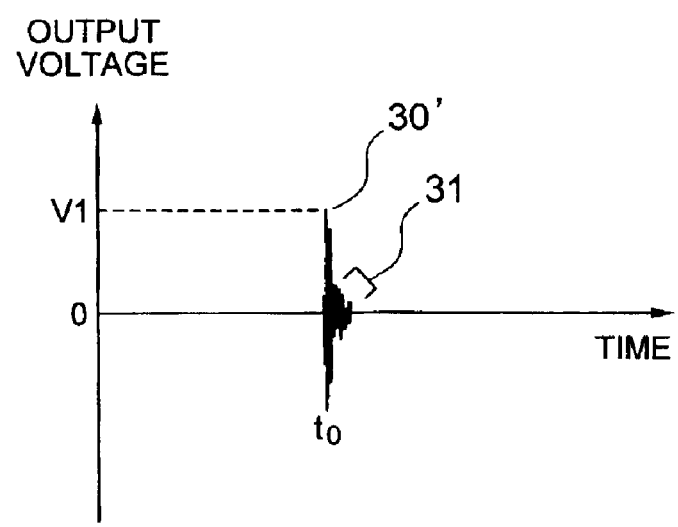

FIG. 2 explains a method that analyzes a detection signal of the AE sensor 29 and diagnoses whether or not assembly in the process chamber 3 is normally carried out. FIG. 2A shows the case where assembly is carried out normally and FIG. 2B shows the case where any fault exists in assembly. The abscissa represents a time (in arbitrary unit), and the origin of coordinates exists at the point when the ultrasonic oscillator 28 applies the oscillation. The ordinate represents the output voltage (in arbitrary unit) of the AE sensor 29.

When assembly is normally carried out, a peak 30 appears at a time t0 as shown in FIG. 2A. In other words, pulse-like ultrasonic wave oscillation emitted from the ultrasonic oscillator 28 reaches the installation position of the AE sensor 29 after the passage of the time t0 and is detected. The absolute value of the detection signal of the AE sensor 29 at the peak is V0.

On the other hand, when any fault exists in assembly as shown in FIG. 2B, a peak 30' appears at the time t0 in the same way as in the normal case but the value of this peak 30' is smaller (V1) than the value V0. In other words, minute gaps develop due to inferior contact between the process chamber cover 2 and the process chamber sidewall 1 and the ultrasonic wave passing through the gaps attenuates. A region 31 in which peaks having smaller absolute values than the peak 30' continue exists immediately after the peak 30' at the time t0. This is because the ultrasonic components that are delayed while propagating the minute gaps created by the inferior contact are received.

As explained above, the AE sensor 29 installed at the upper part of the process chamber wall 1 detects the ultrasonic wave oscillated from the ultrasonic oscillator installed on the process chamber cover 2, and the presence/absence of the fault of assembly can be diagnosed by evaluating the absolute value of the peak 30 appearing in the detection signal of the AE sensor 29, the peak 30' and the region 31 appearing immediately after the peak 30' and having the voltages of the absolute values lower than that of the peak 30'.

Though this embodiment uses the ultrasonic oscillator 28 as the oscillation means, the oscillation means is not particularly limited. Oscillation is not particularly limited to the sound wave, either, and in the case of the sound wave, waves in the audible range can be used, too. The sound waves having a high frequency such as the ultrasonic wave have a drawback that propagation damping is great. However, such sound waves are not easily affected by ambient mechanical noise (such as pump noise) and can improve resolution when position marking is conducted. On the other hand, sound waves of a low frequency has an advantage that propagation damping is small but is not free from drawbacks that they are easily affected by ambient mechanical noise and resolution cannot be easily improved when position marking is conducted. Though an arbitrary frequency can be used in accordance with the environment and with the characteristics of the semiconductor processing apparatus in the invention, sound waves having a high frequency such as the ultrasonic wave are preferably used for the reasons described above.

Though this embodiment uses the AE sensor 29 as the reception means, the reception means is not particularly limited. When oscillation means using a lower frequency is used, for example, an acceleration sensor can be used as the reception means.

In this embodiment, the oscillation means and the reception means are arranged on the process chamber cover 2 and at the upper part of the process chamber sidewall 1, respectively, but the installation positions are not particularly limited. It is possible, for example, to arrange the reception means on the process chamber cover 2 and the oscillation means on the process chamber sidewall 1.

It is further possible to use a plurality of oscillation means and a plurality of reception means. In such a case, different frequency ranges for oscillation may be used and this also holds true of the frequency ranges used for reception. Since the sound waves have the frequency characteristics as described above, a user of the apparatus of the invention may use different frequency ranges that vary depending on the installation positions so that oscillation and reception can be satisfactorily made.

This embodiment can diagnose not only the assembly fault immediately after wet cleaning but also a fixing fault of constituent components. When the reception means is arranged in the proximity of the jig 17 fixing the shower plate, for example, loosening of the bolt 19 that fixes the jig 17 can be detected. In other words, the reception means installed in the proximity of the jig 17 detects the oscillation emitted from the oscillation means and analyzes the reception signal by the same method as that of this embodiment. Loosening of the bolt 19 can be diagnosed by evaluating the existence/absence of the region 31 having voltages of lower absolute values than that of the peak 30' appearing immediately after the peak 30.

The diagnosis of the assembly fault and the fixing fault of the constituent components can be made not only immediately after wet cleaning but also during the process of the semiconductor substrate or between the process steps.

Figure 3:
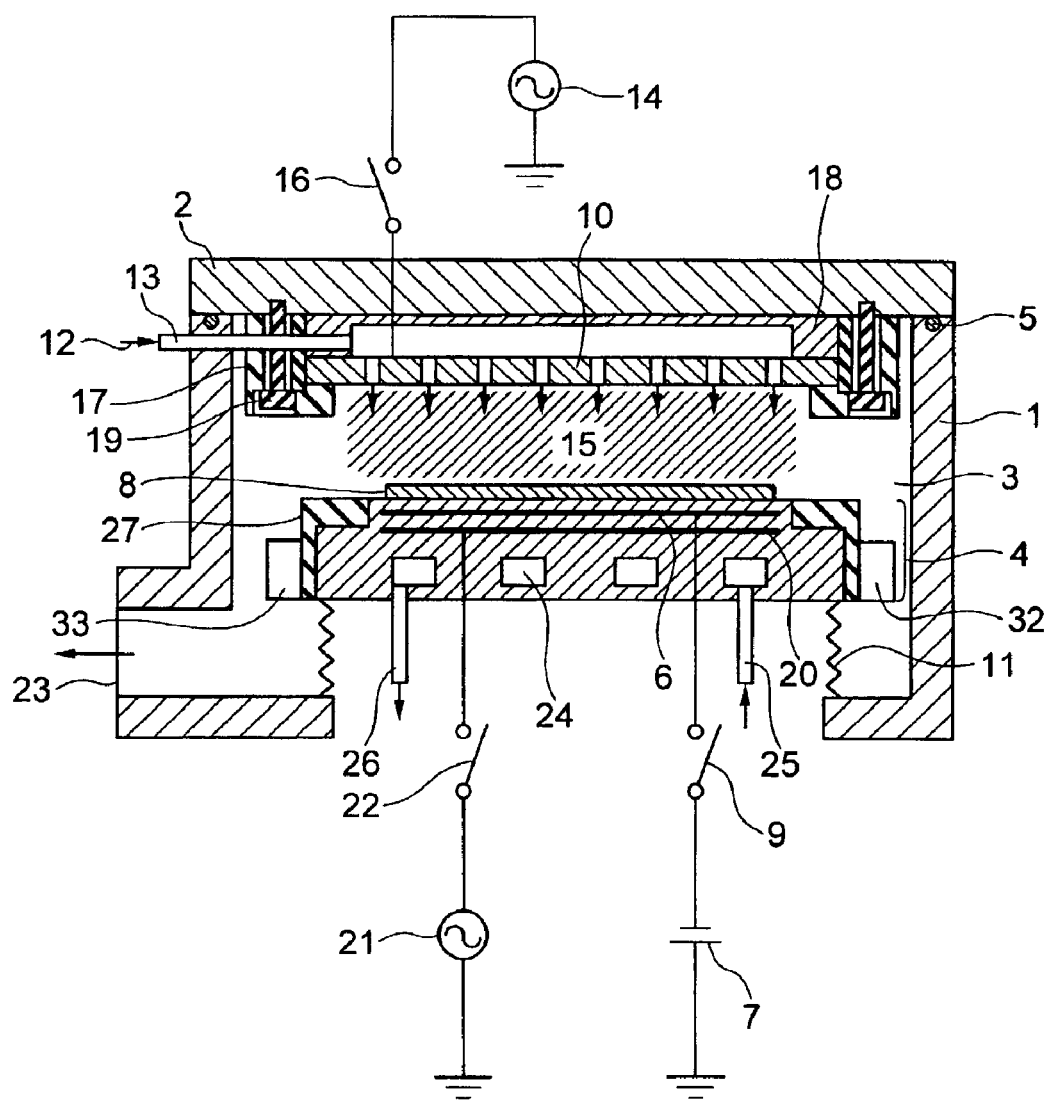
FIG. 3 is a structural illustration explaining a second embodiment.

Referring to FIG. 3 a second embodiment of the invention will be explained. As described above, the cover 27 for protecting the electrostatic suction device 4 from plasma 15 is put on the electrostatic suction device 4. The radio frequency applying electrode 20 is buried into the electrostatic suction device 4. When the bias potential is applied to this electrode 20 through the radio frequency power source 21, the ions generated inside plasma 15 are entrapped into the semiconductor substrate 8 and sputtering is conducted.

The ions in plasma 15 impinge also against the cover 27 arranged in the proximity of the semiconductor substrate 8. Therefore, the cover 27 is gradually cut off and worn out as the semiconductor fabrication process proceeds.

In this embodiment, the sound waves in the audible range are applied to the cover 27 through an audible range sound wave oscillator 32 as the oscillation means, and an acceleration sensor 33 as the reception means detects the sound waves (oscillation) propagating through the cover 27. Oscillation of the cover 27 is analyzed to diagnose the degree of wear of the cover 27.

The frequency of the sound waves applied through the audible range sound wave oscillator 32 is changed either continuously or discretely from the low frequency to the high frequency, and the acceleration sensor 33 as the reception means detects the sound waves (oscillation) propagating through the cover 27. When the frequency of the sound wave applied reaches the resonance frequency of the cover 27, the magnitude of oscillation of the cover 27 drastically increases. The resonance frequency of the cover 27 can be determined when the output signal voltage from the acceleration sensor 33 receiving this oscillation is evaluated.

Because the cover 27 is gradually cut off during the semiconductor fabrication process as described above, the resonance frequency becomes gradually higher. The degree of wear of the cover 27 can be evaluated by determining this resonance frequency and whether or not the cover 27 reaches its service life and is to be exchanged can be diagnosed.

Figure 4:
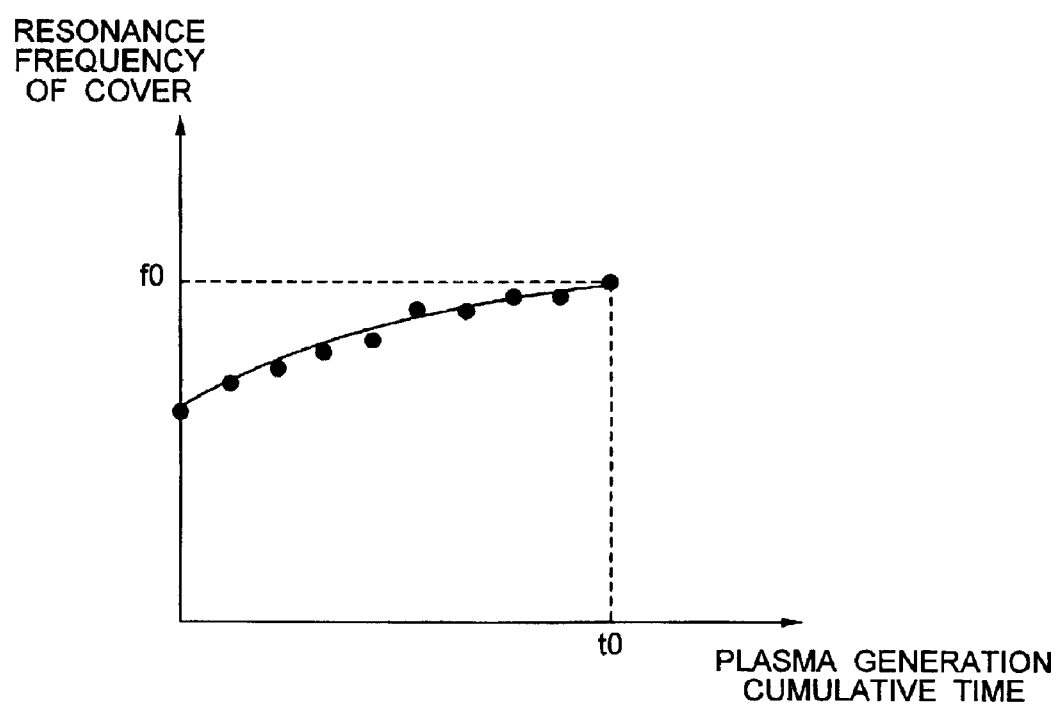
FIG. 4 is a characteristic curve explaining transition of a resonance frequency of a cover.

Referring to FIG. 4 a transition of the resonance frequency of the cover 27 is shown. The abscissa represents the cumulative time (in arbitrary unit) of plasma generation, and the origin represents the time at which the cover 27 is replaced by a new one. The ordinate represents the resonance frequency (in arbitrary unit). Since the resonance frequency of the cover 27 becomes gradually higher as described above, the degree of wear of the cover 27 can be satisfactorily diagnosed by evaluating whether or not the resonance frequency exceeds a predetermined threshold value. In the example shown in FIG. 4, the resonance frequency reaches f0 at the plasma generation cumulative time f0, and the cover 27 can be diagnosed as reaching its life.

The diagnosis of service life may be based not only on the threshold value but also on transition of the changes of a plurality of past numerical value data.

The diagnosis in this embodiment is not limited to the degree of wear by ion sputtering. When any abnormality such as crack occurs in the cover 27, for example, the resonance frequency of oscillation detected by the acceleration sensor 33 greatly deviates from transition of the changes of the past numerical value data. Therefore, abnormality can be detected from this deviation.

This embodiment evaluates the degree of wear of the cover 27 in plasma etching by way of example. However, when deposition of reaction products inside the process chamber is great as in the CVD apparatus, the thickness of the film deposited to the constituent components such as the cover 27 may be evaluated. In the case of the etching apparatus, the resonance frequency becomes gradually higher because the cover 27 is gradually cut off. In the case of the CVD apparatus, on the other hand, the resonance frequency becomes gradually lower as the film of the reaction byproducts is deposited. Therefore, the thickness of the film deposited to the constituent components can be evaluated in the same way as in the case of the etching apparatus.

Figure 5:
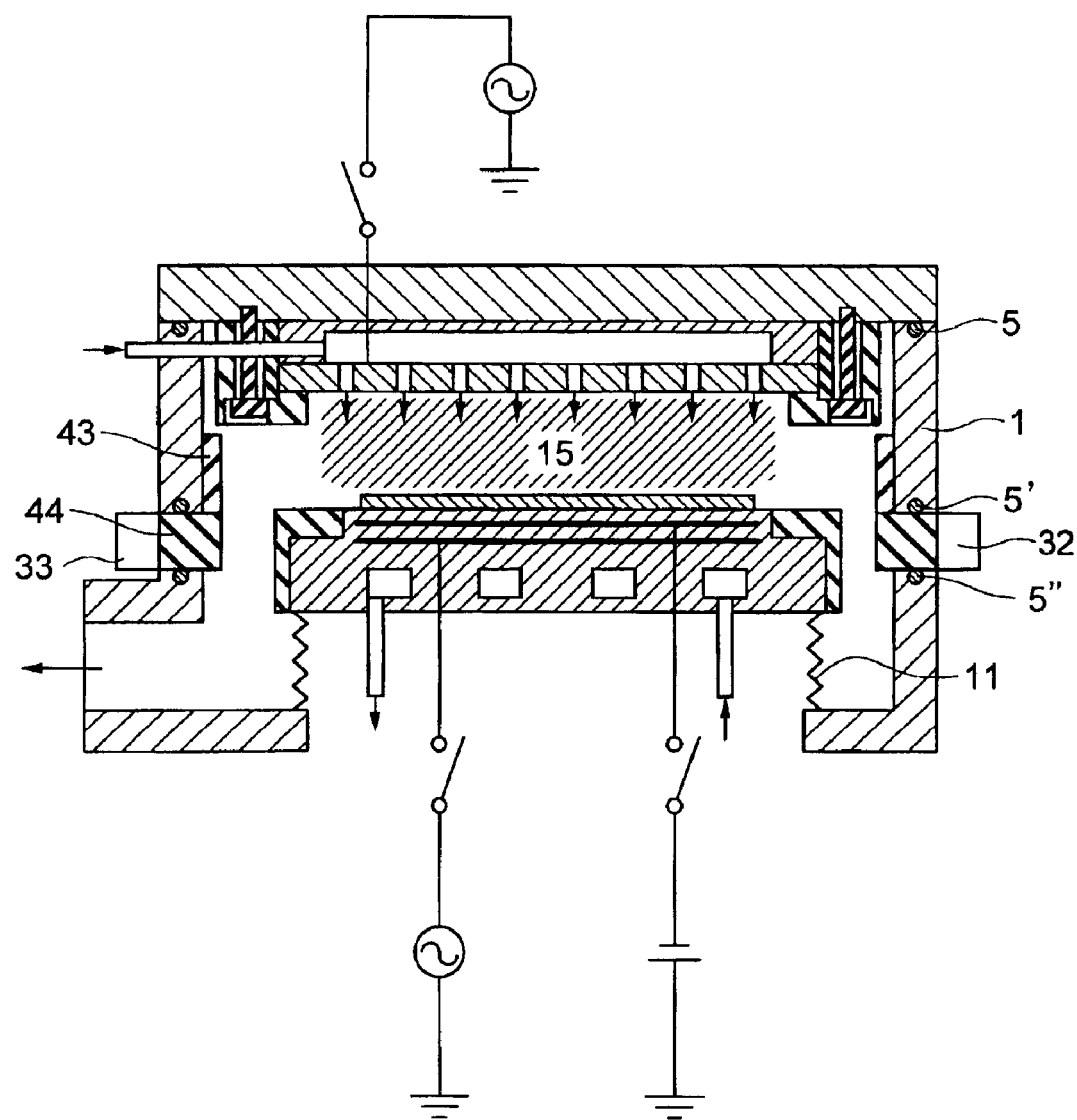
FIG. 5 is a structural illustration explaining a third embodiment.

Referring to FIG. 5 a third embodiment of the invention will be explained. In the second embodiment, the oscillation means and the reception means are directly fitted to the constituent component (cover 27) inside the process chamber the pressure of which is reduced, and the diagnosis of the cover 27 such as its wear and breakage is made under the reduced pressure state. However, similar diagnosis can be conducted for the constituent components inside the process chamber under the vacuum or reduced pressure state so long as they are connected mechanically firmly to the components on the open air side (process chamber sidewall 1, for example).

Referring to FIG. 5 again, a cover 43 is so arranged as to protect the process chamber sidewall 1 from plasma 15, and is firmly connected through a ring 44 and pressure bonding. O-rings 5' and 5" are interposed between the ring 44 and the process chamber sidewall 1 to keep the process chamber 3, that is kept under the reduced pressure, airtight.

In this embodiment, the audible range sound wave oscillator 32 is installed as the oscillation means on the open-air side of the ring 44, and the cover 43 firmly fixed to the ring 44 is caused to oscillate. The acceleration sensor 33 installed on the open-air side of the ring 44 firmly connected to the cover 43 detects this oscillation and its detection signal (oscillation) is analyzed. The degree of wear of the cover 43 can be evaluated by determining the resonance frequency of the cover 43 in the same way as in the third embodiment. It becomes thus possible to diagnose whether or not the cover 43 reaches its service life and to be exchanged.

The diagnosis can be similarly conducted when one of the oscillation means and the reception means is arranged on the side of the open-air and the other, under the reduced pressure environment.

Figure 6:
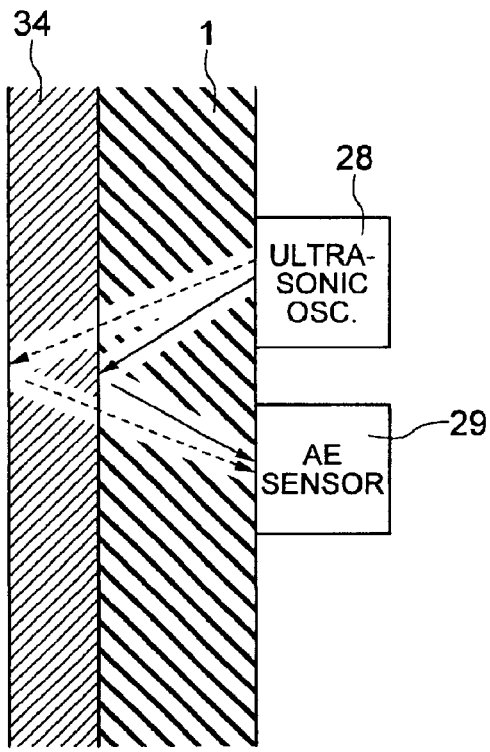
FIG. 6 is an illustration explaining a fourth embodiment.

Referring to FIG. 6 a fourth embodiment of the invention will be explained. As shown in the Figure, the ultrasonic oscillator 28 as the oscillation means and the AE sensor 29 as the reception means are juxtaposed on the open-air side of the process chamber sidewall 1 to evaluate the thickness of a film 34 of reaction byproducts deposited to the process chamber sidewall 1 on the vacuum side. Evaluation of the thickness of the film 34 can be achieved by utilizing the difference of the propagation time created as the ultrasonic waves propagate through different paths. Arrows of solid line in the Figure represents the first path. The ultrasonic wave emitted from the ultrasonic oscillator 28 propagates inside the process chamber sidewall 1, is reflected at the end of the process chamber sidewall 1 on the vacuum side, again propagates inside the process chamber sidewall 1 and is detected by the AE sensor 209. On the other hand, arrows of broken line indicate the second path. The ultrasonic wave emitted from the ultrasonic oscillator 28 propagates inside the process chamber sidewall 1 and inside the film 34 of the reaction products deposited to the process chamber sidewall 1 on the vacuum side, is reflected at the end of the film 34 on the vacuum side, again propagates inside the film 34 and the process chamber sidewall 1, and is detected by the AE sensor 29.

In practice, however, there are paths other than the two paths described above through which the ultrasonic wave propagates. For example, the ultrasonic wave emitted from the ultrasonic oscillator 28 propagates inside the process chamber sidewall 1, is incident into the film 34 of the reaction products deposited to the process chamber sidewall 1 on the vacuum side, propagates inside the film 34, again propagates inside the film, is reflected by the process chamber sidewall 1 on the vacuum side, propagates inside the film 34 is reflected at the end of the film 34 on the vacuum side, propagates inside the film 34, is incident to the process chamber sidewall 1, propagates inside the process chamber sidewall 1 and is detected by the AE sensor 29. However, the ultrasonic wave reflected in multiple has large attenuation and has become an extremely weak signal at the point when the AE sensor 29 finally detects this signal. Therefore, an operation process such as filtration can easily remove the signal and the signal does not impede evaluation of the thickness of the film.

There is also a path through which the ultrasonic wave emitted from the ultrasonic oscillator 28 travels near the surface of the process chamber sidewall 1, directly reaches the AE sensor 29 and is detected by the latter. Though this signal has a large value, it can be easily separated from the signals passing through the first and second paths described above because it reaches the AE sensor 29 more quickly than the signals passing through the first and second paths.

Figure 7:
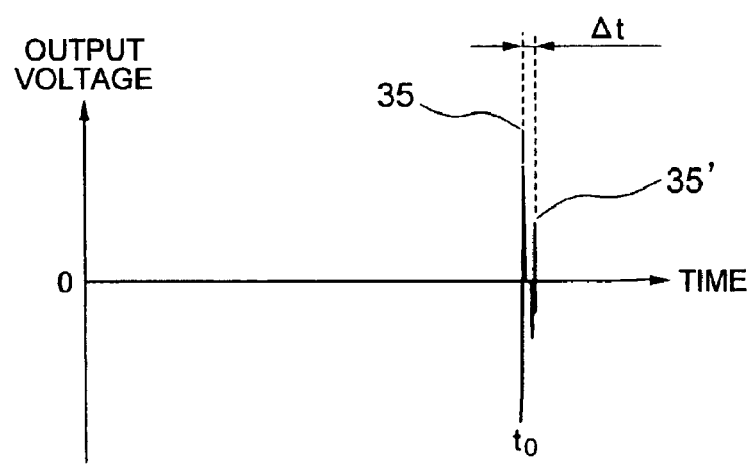
FIG. 7 is an illustration explaining a method of evaluating a thickness of a film of reaction products.

Referring to FIG. 7 a method of evaluating the thickness of the film 34 by use of the detection signal of the AE sensor 29 will be explained. The abscissa represents the time (in arbitrary unit) and the origin represents the point of time at which the ultrasonic oscillator 28 emits the sound wave. The ordinate represents the output voltage (in arbitrary unit) of the AE sensor detecting the ultrasonic wave.

First, the peak 35 of the ultrasonic wave reaching the AE sensor 29 through the first path is detected at the point t0. Next, the peak 35' of the ultrasonic wave reaching the AE sensor 29 through the second path is received. The second path has a longer propagation distance than the first path because the ultrasonic wave propagates inside the film 34 as described above. In consequence, the peak 35' appears more belatedly by time difference Δt than the peak 35. The thickness of the film 34 of the reaction products deposited to the process chamber sidewall 1 inside the process chamber can be evaluated without releasing the process chamber when the time difference Δt appearing in these two peaks is determined. Incidentally, the ultrasonic wave signal propagating through the second path is incident and is reflected a greater number of times and is attenuated much more than the signal through the first path on the interface between the process chamber sidewall 1 and the film 34. Therefore, the signal finally detected by the AE sensor 29 is smaller than the signal propagating through the first path.

Figure 8:
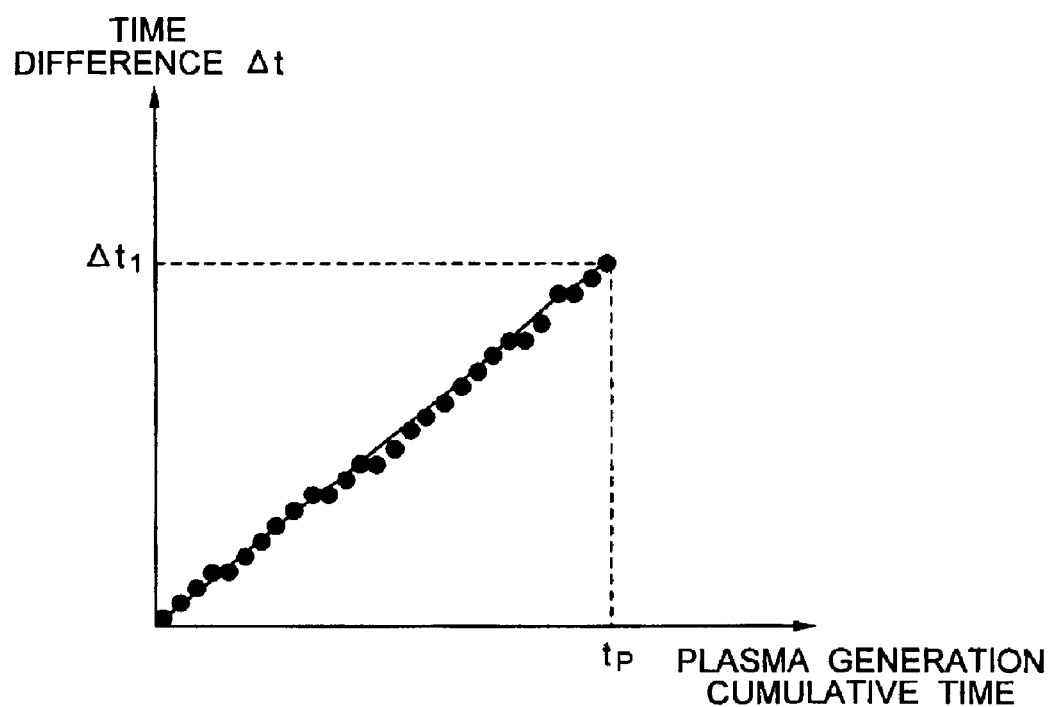
FIG. 8 is a characteristic curve explaining transition of a time difference of a peak of ultrasonic wave.

Referring to FIG. 8 a transition of the time difference Δt of the peaks described above will be explained. The abscissa represents a plasma generation cumulative time (in arbitrary unit), and the origin represents the point of time at which the reaction products deposited to the process chamber sidewall are completely removed by wet cleaning, for example. The ordinate represents the time difference Δt (in arbitrary unit) of the two peaks.

As the thickness of the film deposited to the process chamber sidewall becomes gradually great, the time difference Δt gradually becomes great, too. Therefore, when the time difference Δt corresponding to the film thickness at which peel of the film is anticipated is set in advance as a threshold value, it is possible to diagnose whether or not wet cleaning be carried out by judging whether or not the time difference Δt exceeds the threshold value.

In the example shown in FIG. 8, the time difference Δt reaches Δt1 at the plasma generation cumulative time tp. This point of time Δt1 can be regarded as the state immediately before the occurrence of peel of the film 34 or in other words, this point can be diagnosed as the timing at which wet cleaning be carried out.

If the velocity of sound inside the material of the process chamber sidewall 1 and the velocity of sound in the film 34 of the reaction products are known in advance, the thickness of the film 34 can be determined accurately. However, there is sometimes the case where the velocity of sound in the film 34 of the reaction products is not known and consequently, the thickness of the film cannot be determined accurately. In such a case, the time difference Δt1 of the two peaks is set as the threshold value for the film thickness at which peel of the film occurs as described above. It becomes thus possible by measuring Δt to judge whether or not the thickness of the film 34 is the film thickness at which peel of the film occurs and to judge the timing of wet cleaning.

Incidentally, this embodiment arranges both oscillation means and reception means on the process chamber sidewall 1 and evaluates the film thickness of the reaction products deposited to the process chamber sidewall 1 inside the process chamber. However, the evaluation position is not limited to the process chamber sidewall. When the oscillation means and the reception means are installed on the shower plate, for example, the thickness of the film deposited to the shower plate can be evaluated. A plurality of oscillation means and a plurality of reception means may be installed, too. When the oscillation means and the reception means are respectively installed at the upper and lower parts of the process chamber sidewall 1 and on the shower plate, for example, it becomes possible to evaluate the film thickness deposited at each position inside the process chamber and to diagnose whether or not wet cleaning is to be carried out. In this case, wet cleaning should be carried out if the result of diagnosis indicates that wet cleaning be carried out at any of these positions.

When the timing of wet cleaning is diagnosed through comparison with the threshold value Δt1 of the time difference Δt by evaluating the film thickness at a plurality of positions, the same threshold value or different threshold values may be used at all the positions. When the deposition film on the process chamber sidewall has a property such that its peel is more difficult to occur than the deposition film on the shower plate, for example, the threshold value for the deposition film on the process chamber sidewall is preferably greater than the threshold value for the deposition film on the shower plate.

The oscillation means and the reception means for evaluating the film thickness deposited on the process chamber sidewall 1 on the process chamber side are installed on the open air side. However, when the oscillation means and the reception means are installed under the vacuum or reduced pressure environment, the wet cleaning timing can be diagnosed when the evaluation of the film thickness is made in the same way as described above. To evaluate the film thickness, the shift of the changes from the past numerical value data may be used for judgment besides the threshold value described above.

Figure 9:
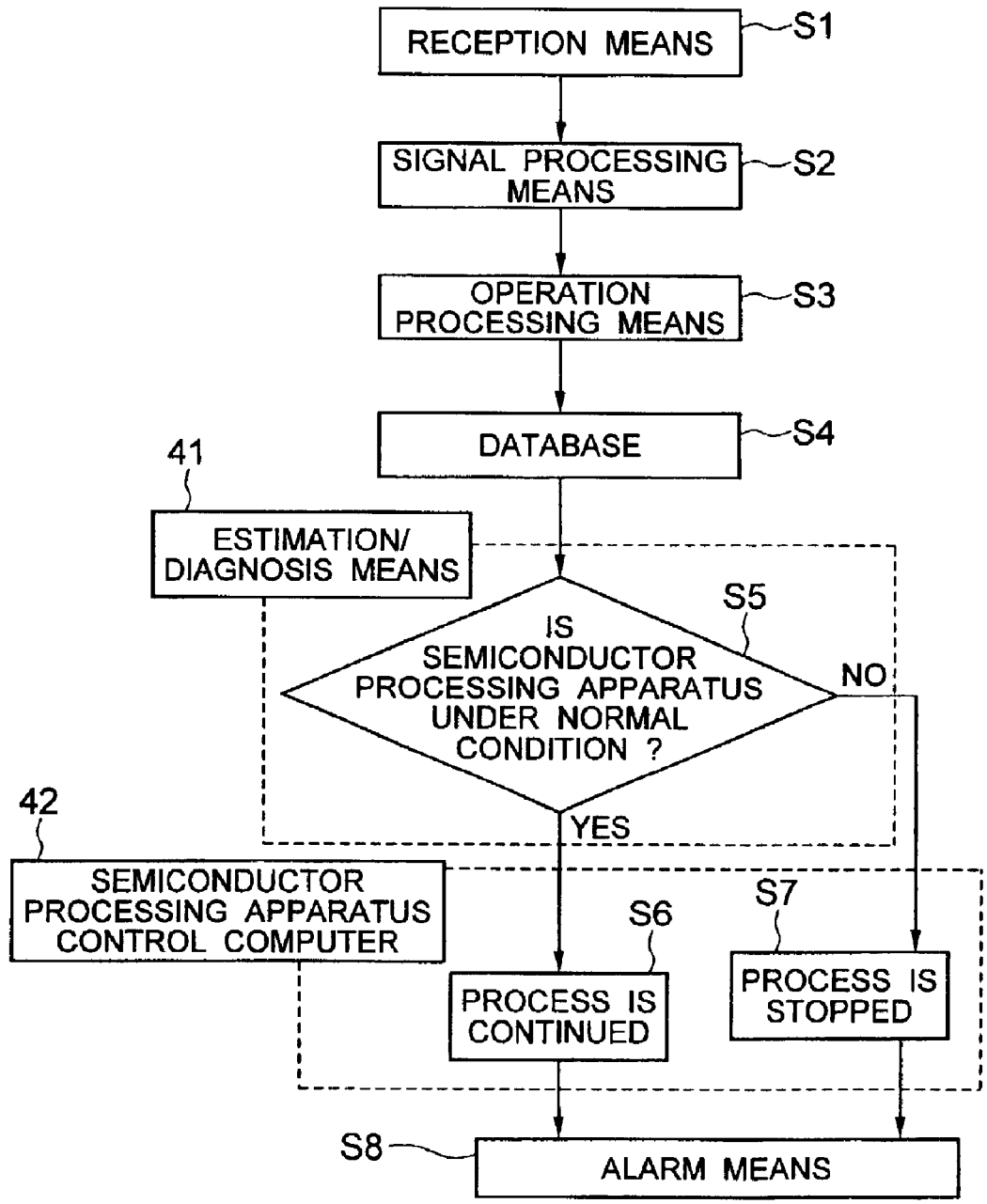
FIG. 9 is a flowchart for explaining a sequence of a semiconductor process carried out by use of a semiconductor processing apparatus according to the invention.

FIG. 9 is a flowchart useful for explaining the sequence of the semiconductor process executed by use of the semiconductor processing apparatus explained above.

First, the reception means such as the AE sensor receives the ultrasonic wave emitted from the oscillation means such as the ultrasonic oscillator (Step S1). The reception signal of the reception means is transferred to the signal processing means and is converted to digital data (Step S2). Next, this digital data is transferred to the operation processing means and is subjected to an operation process. The operation process includes a frequency analysis by executing an FFT (Fast Fourier Transform) process, noise elimination by executing a filtering process, and a compression process of the digital data (Step S3). After this operation process, the digital data is stored in a database. The database can store the threshold value used for the diagnosis or data representing its range besides the digital data.

Next, the digital data is transferred to estimation/diagnosis means 41. The estimation/diagnosis means 41 compares the digital data with the threshold value stored in the database or with the past history data and diagnoses whether or not the semiconductor processing apparatus is now under the normal condition. To make this diagnosis, whether or not the digital data exceeds a predetermined threshold value or its range is judged, for example. Comparison with the history data under the normal condition may be used, too. Furthermore, the shift of the change from a plurality of past history data is determined and judgment may be made on the basis of this shift. The estimation/diagnosis means 41 can diagnose whether or not the semiconductor processing apparatus is now under the normal condition and can also conduct estimation. In other words, the estimation/diagnosis means 41 analyzes the shift of the past history data stored in the database, and can estimate that the subsequent wet cleaning should be carried out after how many hours, or can estimate after how many hours constituent components inside the process chamber reach their service life (Step S5).

Next, the diagnostic result is transferred to a computer 42 for controlling the semiconductor processing apparatus. The semiconductor processing apparatus controlling computer 42 continues processing when the diagnostic result is normal (Step S6), and stops the processing and raises an alarm when the diagnostic result proves abnormal (Steps S7 and S8).

When the estimation result of the estimation/diagnosis means indicates the wet cleaning timing or the life of the constituent components, the process is continued as such and alarm means raises an alarm (Steps S6 and S8).

The alarm may use sound of a buzzer or may notify an operator of warning on a monitor screen of the apparatus. If the semiconductor processing apparatus is connected to a computer network, warning may be transmitted to operators and engineers at a remote place through the E-mail, or these means may be combined together. For example, the alarm means may be the one that notifies abnormality in the chamber assembly, abnormality in the arrangement of constituent components, the necessity for conducting wet cleaning to prevent peel of the film inside the process chamber or the life of the constituent components.

The embodiment described above uses the ultrasonic oscillator or the audible range sound wave oscillator as the oscillation means, but can use oscillation created when the treating pressure of the semiconductor processing apparatus is drastically changed, too. The embodiment can further use oscillation created by an instantaneous pressure change that occurs when plasma is generated.

The explanation given above has dealt with the plasma etching apparatus as an example of the semiconductor processing apparatus. However, the invention can of course be applied to other semiconductor processing apparatuses such as plasma CVD, thermal CVD, sputtering, and so forth.

As explained above, this embodiment arranges the oscillation means and the reception means in the semiconductor processing apparatus, and can diagnose the presence/absence of assembly after wet cleaning, the degree of wear of the constituent components inside the process chamber and the timing of wet cleaning through the evaluation of the reaction products deposited to the inner wall of the process chamber. Therefore, the embodiment can improve the production yield in the semiconductor manufacture.

Next, a plasma etching apparatus according to a fifth embodiment of the invention will be explained.

Figure 10:
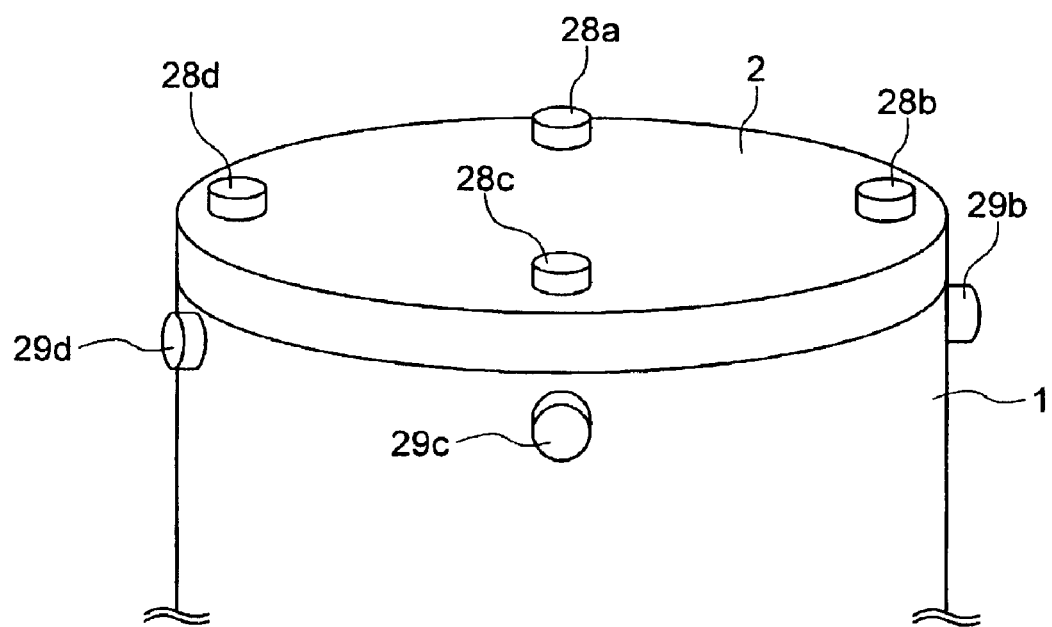
FIG. 10 is a bird's-eye view of a process chamber and is useful for explaining a fifth embodiment.

FIG. 10 is a bird's-eye view of a substantially cylindrical process chamber 3 of the plasma etching apparatus when it is viewed from outside. Four ultrasonic oscillators 28a, 28b, 28c and 28d as oscillation means are equidistantly installed at an angle of 90 degrees on the process chamber sidewall 1. Four AE sensors 29a, 29b, 29c and 29d as reception means are installed at an upper part of the process chamber sidewall 1. Oscillation by the ultrasonic oscillators 28a to 28d and reception by the AE sensors 29a to 29d are made respectively and independently so as to specify the coordinates of the assembly fault position immediately after wet cleaning.

Figure 11:
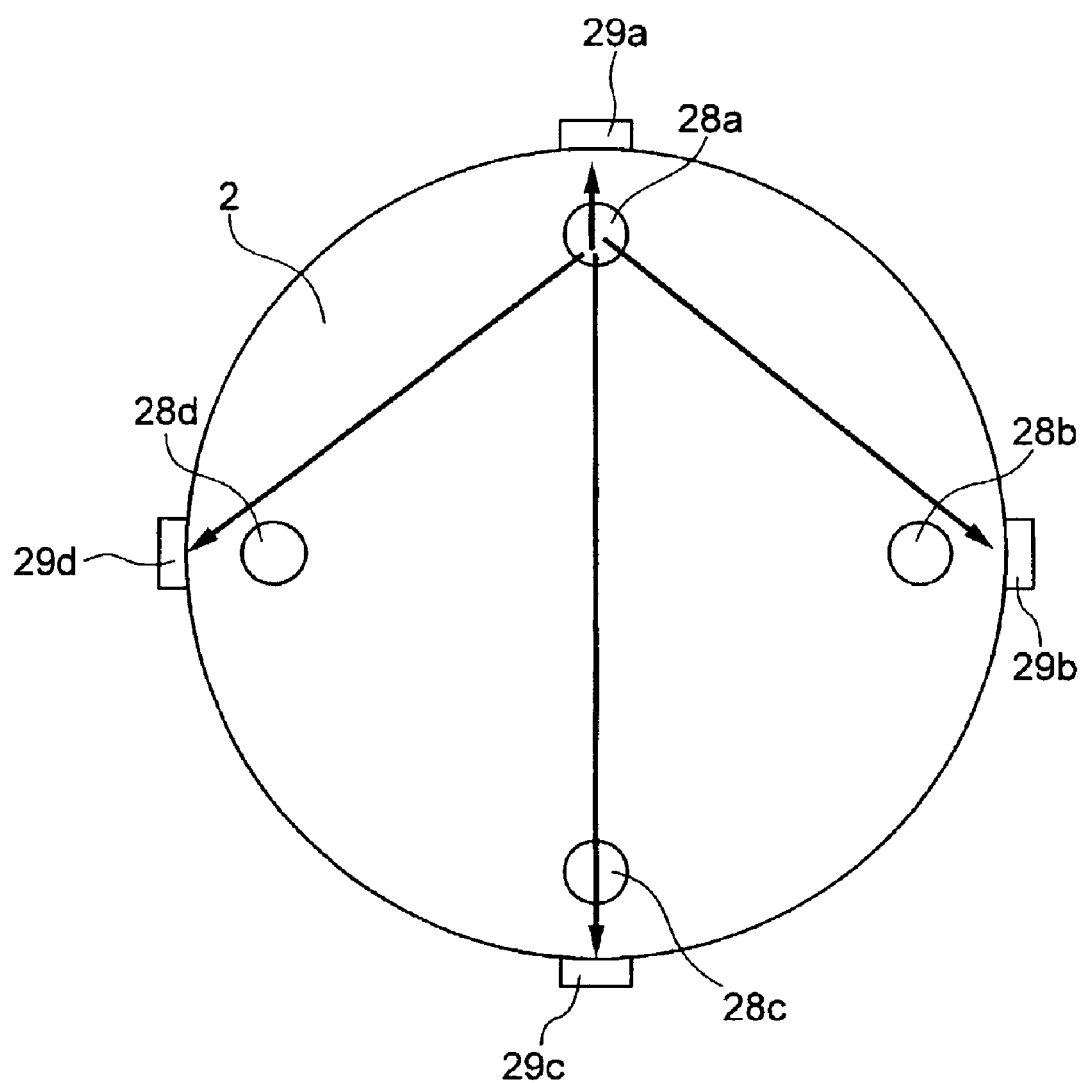
FIG. 11 is an illustration which explains propagation of ultrasonic wave when assembly in the process chamber is normal.
Figure 12:
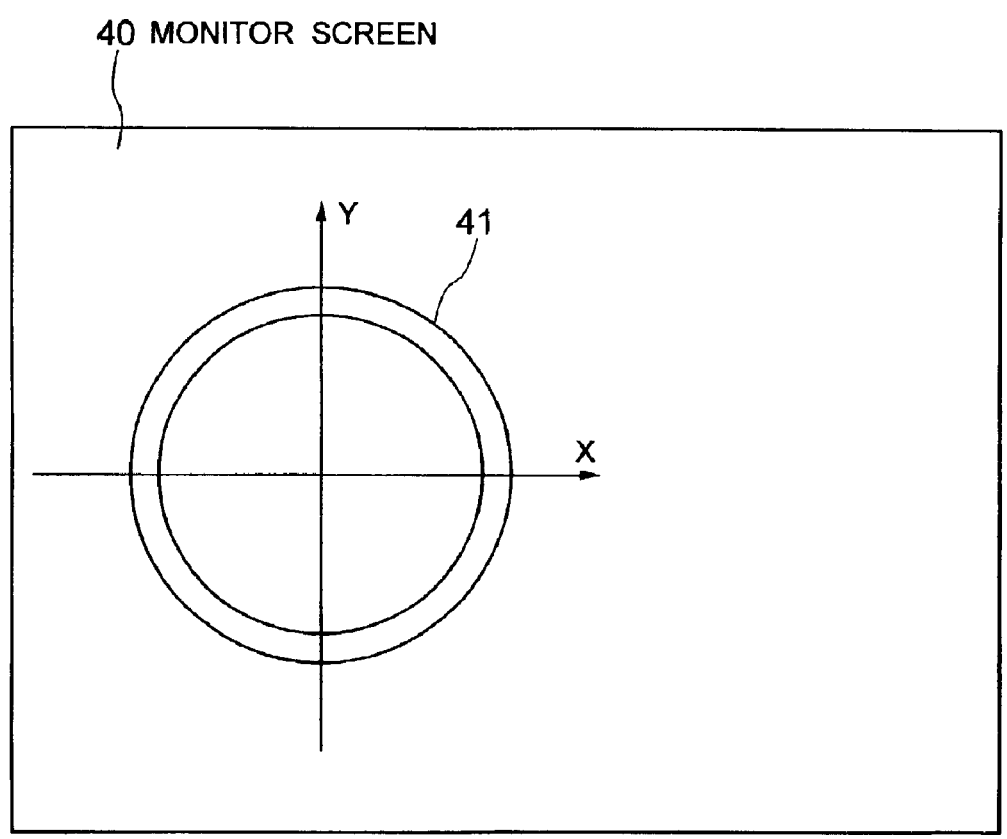
FIG. 12 is a diagram which shows a display state of a monitor screen installed to a processing apparatus when assembly in the process chamber is normal.

FIG. 11 is a top view that shows the process chamber cover 2 put on the substantially cylindrical process chamber 3 when it is viewed from immediately above. Arrows of solid line represent the reception mode of sound wave oscillation from the ultrasonic oscillator 28a by the AE sensors 29a to 29d. When no fault exists in assembly of the process chamber cover 2, the peak 30 (see FIG. 2) resulting from the pulse-like ultrasonic wave from the ultrasonic oscillator 28a appears in the analytical result of the output voltages of the AE sensors 29a to 29d as already described. However, because the region 31 resulting from the fault and having a voltage of a lower absolute value than the peak described above does not appear, the absence of the fault can be detected. At this time, the absence of the fault may be displayed on the monitor screen 40 of the semiconductor processing apparatus as shown in FIG. 12. In the Figure, a doughnut-like region 41 represents the contact portions between the process chamber wall 1 and the process chamber cover 2.

Figure 13:
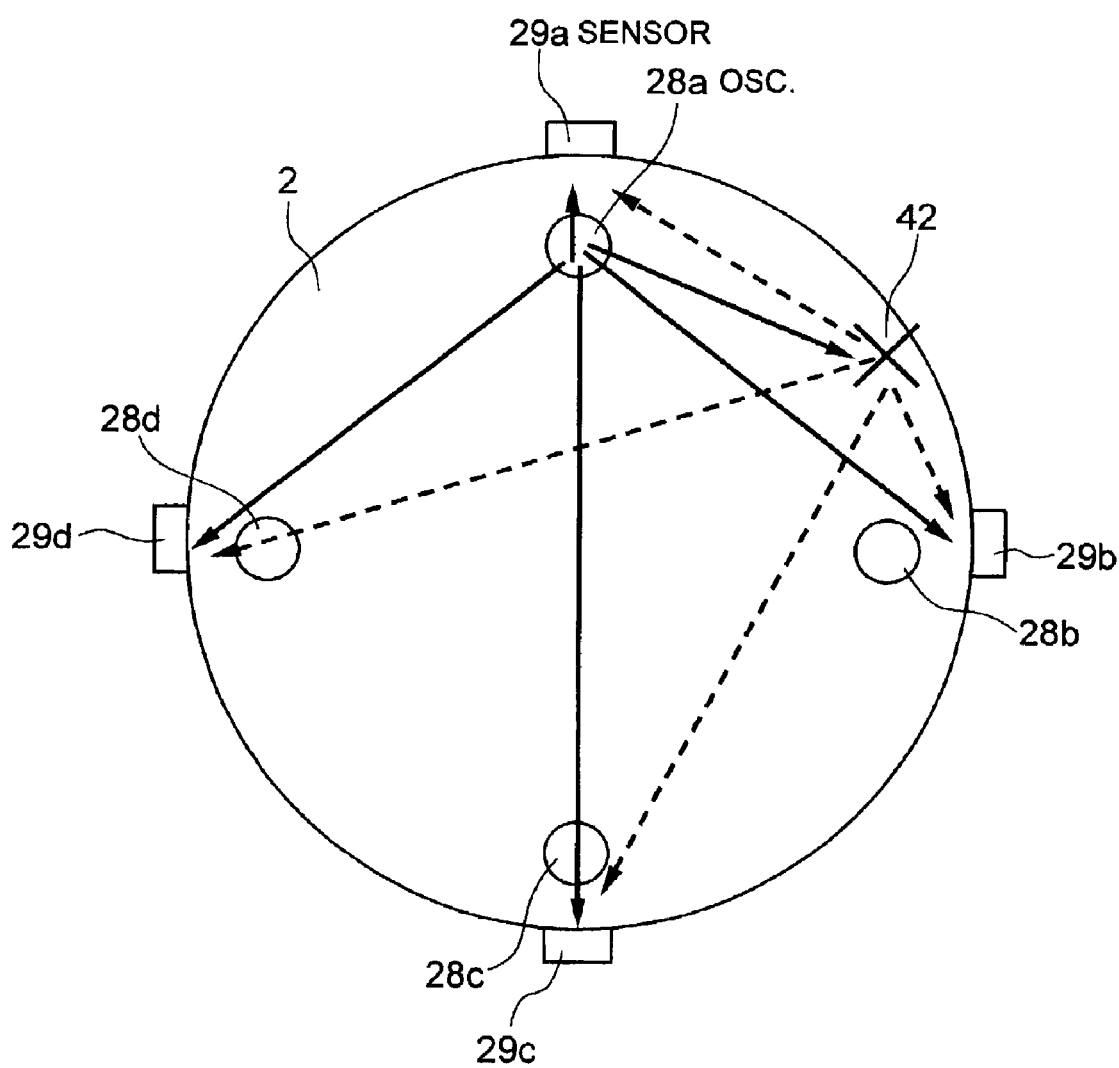
FIG. 13 is an illustration which explains propagation of the ultrasonic wave when assembly in the process chamber has any fault.
Figure 14:
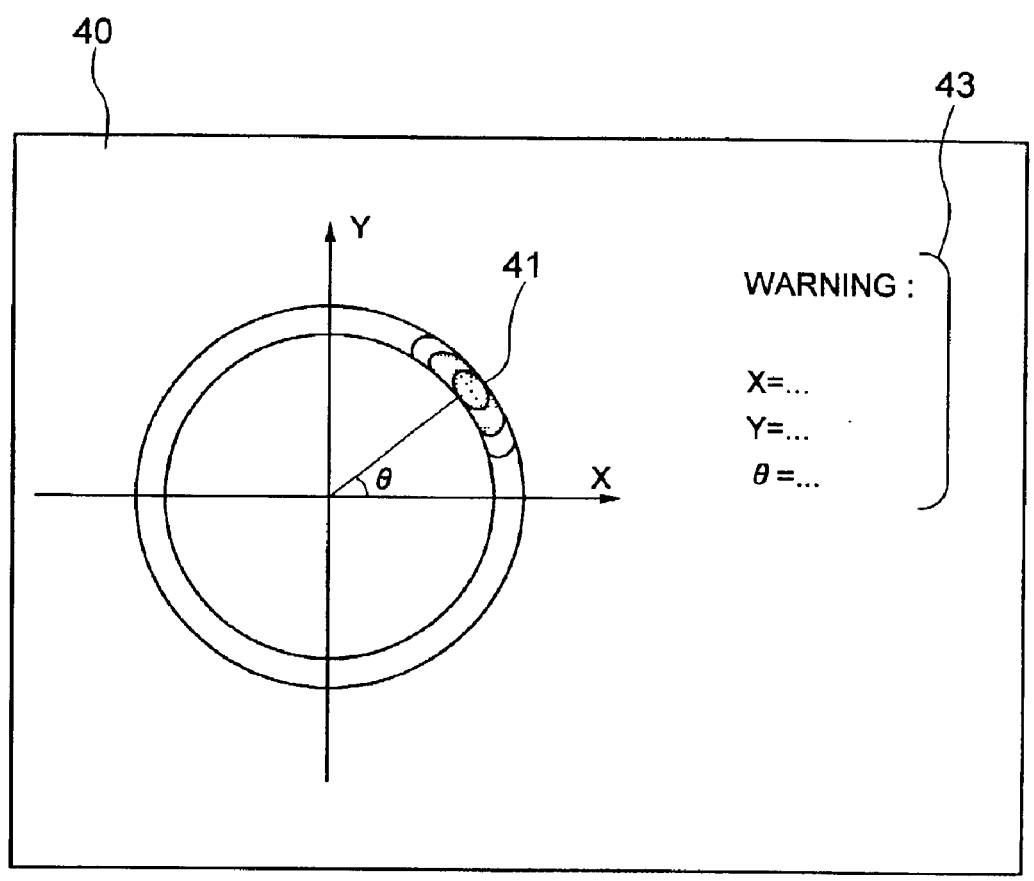
FIG. 14 is a diagram which shows a display state of the monitor screen installed to the processing apparatus when assembly in the process chamber has any fault.

When the fault 42 exists as shown in FIG. 13, on the other hand, the region 31 (see FIG. 2) resulting from the fault 42 and having a voltage of an absolute value lower than the peak 30 described above is observed in the analytical result of the output voltages of the AE sensors 29a to 29d besides the ed peak 30 resulting from the pulse-like ultrasonic wave from the ultrasonic oscillator 28a, as explained in the first embodiment. Since the distances from the fault position 42 to the AE sensors 29a to 29d are mutually different as indicated by arrows of broken line, the coordinates of the fault position can be specified when these output voltages are analyzed. In this instance, it is possible to display the fault position in the doughnut region 41 and its coordinates 42 on the monitor screen 40 of the semiconductor processing apparatus as shown in FIG. 14.

When a plurality of ultrasonic oscillators 28 are used, they may have the same or different frequency regions used for oscillation. This also holds true of the frequency range of the AE sensors 29 used for reception. Since sound wave oscillation has the frequency characteristics described already, however, oscillation having a high frequency such as the ultrasonic wave is preferably used to improve resolution when specifying the coordinates of the position as the cause of the fault.

This embodiment can diagnose not only the assembly fault immediately after wet cleaning but also the fixing fault of the constituent components. When the reception means is installed in the proximity of the bolts 19 fixing the shower plate 10 and the jig 17, for example, it is possible to detect which of a plurality of bolts 19 is loose. In other words, the reception means installed in the proximity of the bolt 19 detects oscillation generated by the oscillation means, specifies the coordinates of the fault position in the same way as the method of this embodiment and can diagnose which bolt 19 is loose.

As already described, dry cleaning such as plasma cleaning or gas cleaning is conducted in the same way as in the fourth embodiment to remove the deposition film on the process chamber sidewall without opening the chamber. The end point of dry cleaning can be detected when the thickness of the deposition film on the process chamber sidewall is monitored.

In other words, the ultrasonic oscillator 28 oscillates the ultrasonic wave, the AE sensor 29 receives the sound wave oscillation and the method described above detects the thickness of the film 34 adhering to the process chamber sidewall 1. Cleaning may be finished when the film 34 is completely removed and its thickness reaches 0.

When the thickness of the film 34 is detected during dry cleaning, the detection result of the thickness of the film 34 sometimes differs from the actual thickness because plasma generated for dry cleaning heats the film 34 and the process chamber sidewall 1 and the velocity of sound transmitting through them changes. However, what is important is to detect the removal of the film 34 but not to determine the correct thickness of the film 34. When the thickness of the film 34 reaches 0, adverse influences of the change of the velocity of sound on the detection of the thickness of the film 34 do not exist. Therefore, the change of the velocity of sound due to heating of the film 34 and the process chamber sidewall 1 by plasma for dry cleaning does not impede the detection of the end point of dry cleaning.

Since this embodiment uses a plurality of ultrasonic oscillators 28 and a plurality of AE sensors 29, it can detect the thickness of the film at a plurality of positions of the process chamber sidewall and can conduct high precision end point detection of dry cleaning and optimization of the cleaning condition.

Figure 15:
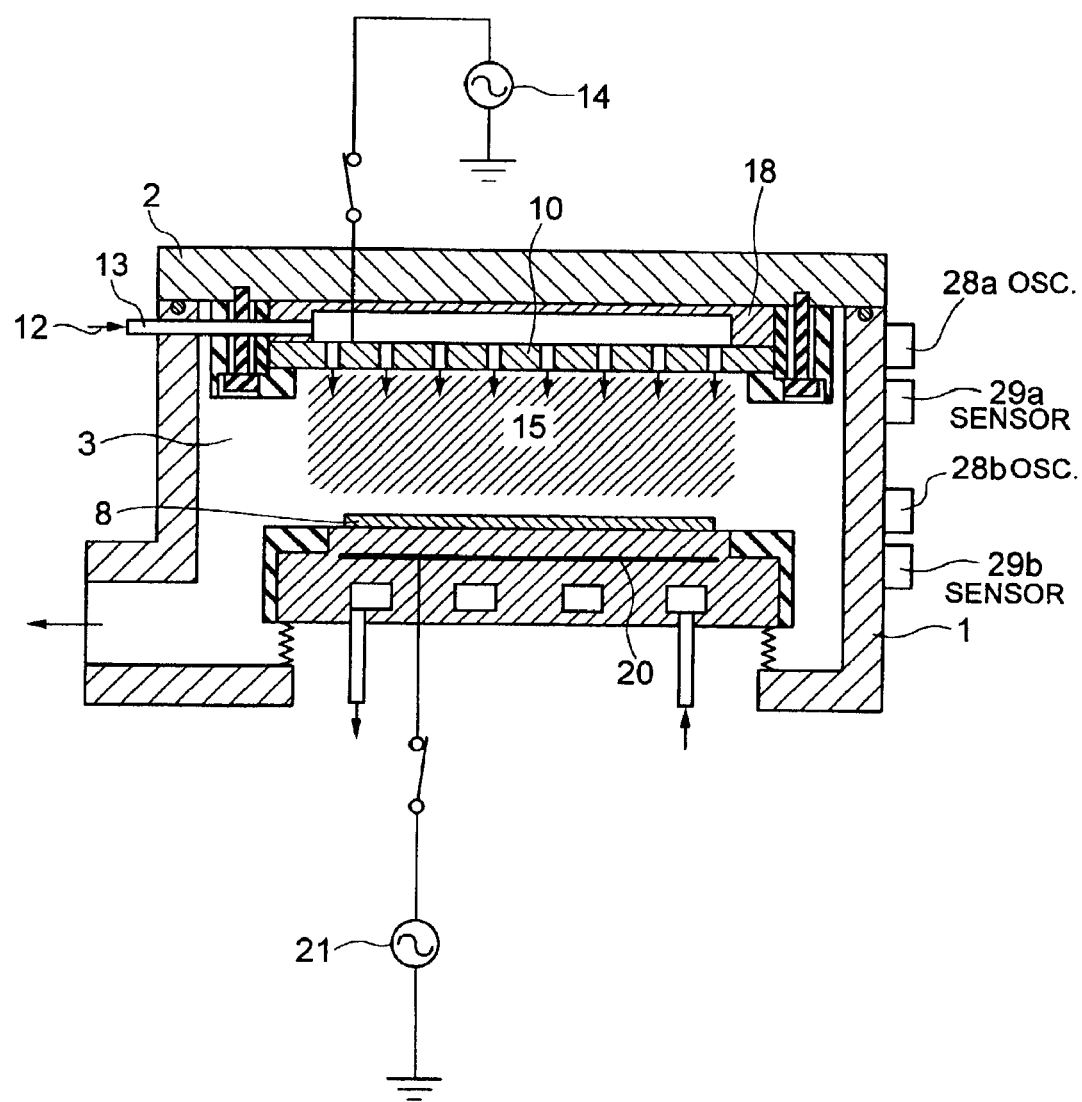
FIG. 15 is a constructional diagram which explains a parallel flat sheet type plasma etching apparatus according to a sixth embodiment of the invention.

Referring to FIG. 15 a parallel flat sheet type plasma etching apparatus according to a sixth embodiment of the invention will be explained. The ultrasonic oscillator 28a and the AE sensor 29a are installed at an upper part of the processing chamber sidewall 1 and the ultrasonic oscillator 28b and the AE sensor 29b, at a lower part of the process chamber sidewall 1.

Figure 16:
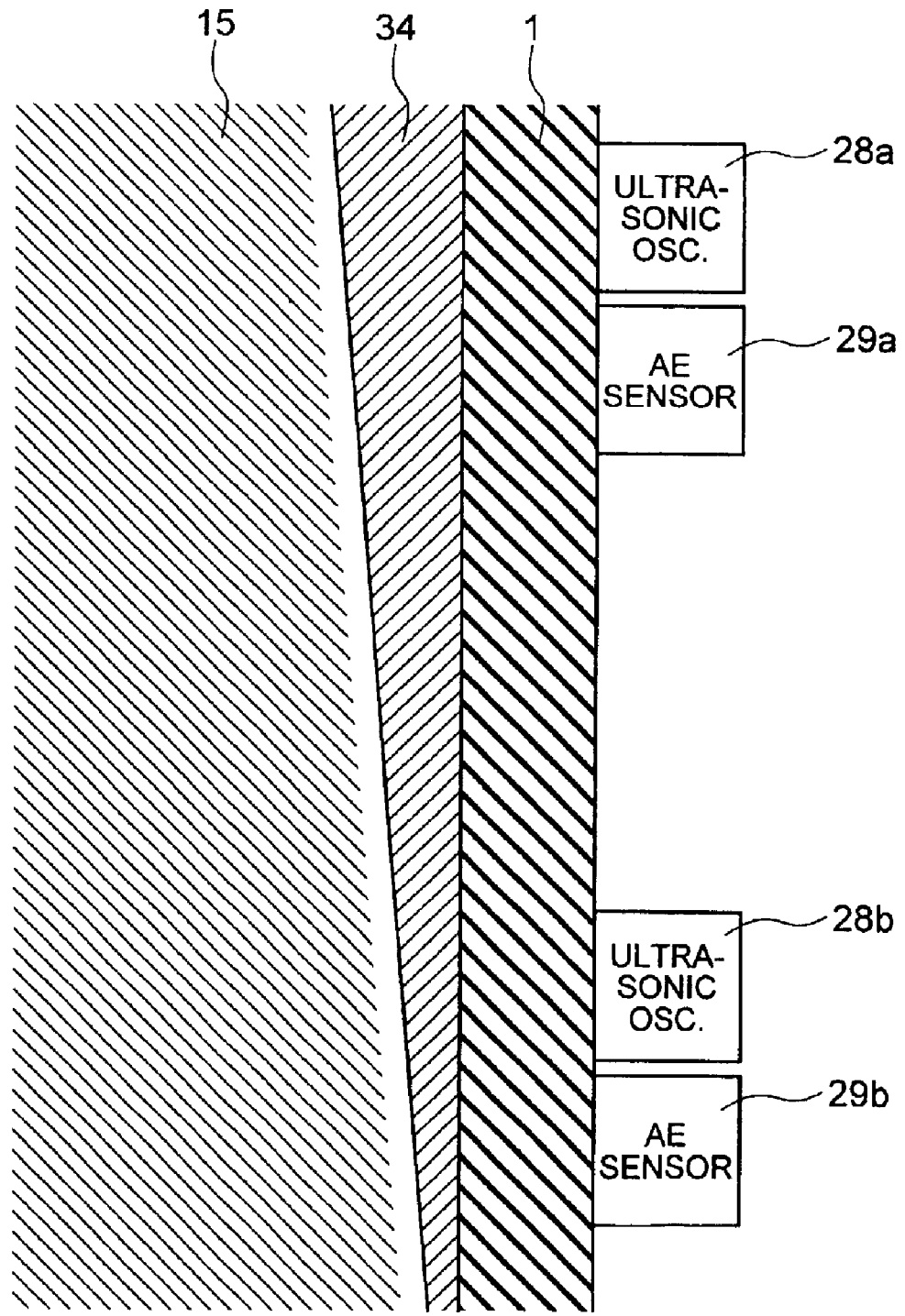
FIG. 16 is an enlarged view of portions in the proximity of a wall of the process chamber of the etching apparatus shown in FIG. 15.

FIG. 16 shows in magnification the portion in the proximity of the process chamber sidewall 1 during the execution of dry cleaning. Plasma 15 for dry cleaning is generated to remove the film 34. The thickness of the film 34 in the proximity of the ultrasonic oscillator 28a and the AE sensor 29a and the thickness of the film 34 in the proximity of the ultrasonic oscillator 28b and the AE sensor 29b are detected by the method described above, respectively. When the film 34 remains even after either one of the films 34 is removed, dry cleaning is continued. The point at which removal of both films 34 is detected can be regarded as the end point of dry cleaning.

As described above, this embodiment uses a plurality of ultrasonic oscillators 28 and a plurality of SE sensors 29 and can detect highly accurately the detection of the end point of dry cleaning.

In this embodiment, the ultrasonic oscillators 28 and the AE sensors 29 are installed at two positions, but the number of installation positions is not limited to 2. When three or more ultrasonic oscillators 28 and AE sensors 29 are respectively installed, the point at which removal of the film 34 is detected at all the positions can be regarded as the end point of dry cleaning.

When the thickness of the film 34 at the upper part of the process chamber sidewall 1 is greater than the thickness of the film 34 at the lower part as shown in FIG. 16, the lower film 34 is more quickly removed than the film 34 at the upper part and the dry cleaning time gets elongated in most cases to remove the residual film 34 at the upper part, resulting in the lowering of through-put of the semiconductor processing apparatus. In this case, drying cleaning is made at the lower part of the process chamber sidewall 1 even after the film 34 is removed, so that the sidewall 1 is likely to be worn out. Therefore, the dry cleaning rate at the lower part of the process chamber sidewall 1, that is, the removing rate of the film 34 at the lower part of the process chamber sidewall 1 is preferably greater than the rate at the lower part of the process chamber sidewall 1. To achieve this object, the thickness of the film 34 remaining on the process chamber sidewall 1 is detected at a plurality of positions during the execution of dry cleaning, and the process condition of dry cleaning is changed to raise the dry cleaning rate at positions where the film 34 is thick in comparison with positions where the film 34 is thin.

Figure 17:
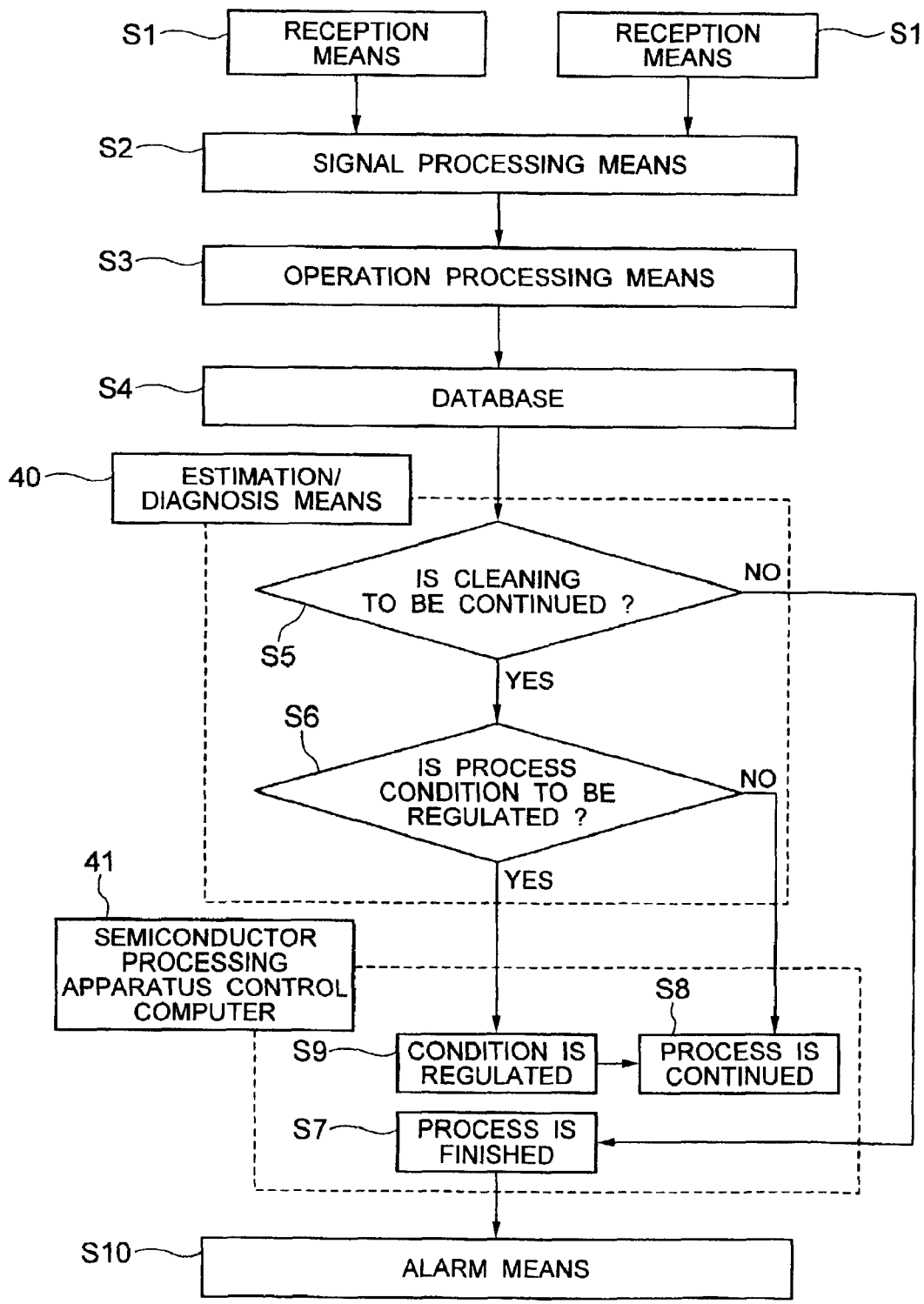
FIG. 17 is a flowchart which explains a sequence of dry cleaning carried out by use of the semiconductor processing apparatus according to the invention.

A concrete method of detecting the end point of dry cleaning and changing the process condition of dry cleaning by use of a plurality of oscillation means and a plurality of reception means will be explained with reference to FIG. 17.

First, a plurality of reception means such as the AE sensors receives sound wave oscillation emitted from any of the oscillation means such as the ultrasonic oscillators (Step S1). Though the Figure shows two reception means, the number of reception means is not limited to two, and three or more reception means may be used.

The reception signal received by the reception means is transferred to signal processing means and is converted to digital data (Step S2).

Next, this digital data is transferred to operation processing means and subjected to operation processing. Examples of this operation processing include frequency analysis such as FFT (Fast Fourier Transform), noise elimination capable of conducting filtration and a compression process of digital data (Step S3).

The digital data after the operation process is stored in a database. The database can store threshold values used for estimation/diagnosis to be next described and data representing their ranges besides the digital data described above. The database can further store not only the data acquired during dry cleaning but also data acquired during semiconductor processing other than dry cleaning such as etching (Step S4).

The digital data is next transferred to estimation/diagnosis means 40. The estimation/diagnosis means 40 judges from the digital data whether or not the film 34 is removed and whether or not dry cleaning is to be continued (Step S5). When it judges that dry cleaning is to be continued, the estimation/diagnosis means 40 judges whether or not the dry cleaning condition is to be regulated (Step S6).

Next, the signal of the estimation/diagnosis result by the estimation/diagnosis means 40 is transferred to the semiconductor processing apparatus control computer 41. The computer 41 controls the semiconductor processing apparatus on the basis of the signals from the estimation/diagnosis means 40.

When the estimation/diagnosis apparatus 40 judges that dry cleaning should be completed, for example, the switches 16 and 22 (see FIG. 1) are turned OFF to stop the application of the radio frequency or the introduction of the process gas so that the dry cleaning process can be finished (Step S7).

When the estimation/diagnosis means 40 judges that dry cleaning is to be executed and that the process condition of dry cleaning should not be regulated, dry cleaning is continued without regulating the process condition (Step S8).

When the estimation/diagnosis means 40 judges that dry cleaning is to be executed and that the process condition of dry cleaning should be regulated, the process condition is regulated and dry cleaning is continued (Step S9). When the thickness of the film 34 at the upper part of the process chamber sidewall 1 is greater than the thickness of the film 34 at the lower part as shown in FIG. 13, radio frequency power applied to the shower plate 10 is raised to increase the density of plasma 15 at the upper part of the process chamber 3 as means for regulating the process condition of dry cleaning. In this way, the dry cleaning rate, that is, the removing rate of the film 34, at the upper part of the process chamber wall 1 can be elevated. When the thickness of the film 34 at the lower part of the process chamber sidewall 1 is greater than the thickness of the film 34 at the upper part as shown, on the contrary, radio frequency power applied to the radio frequency power impression electrode 20 is raised to increase the density of plasma 15 at the lower part of the process chamber 3 as means for regulating the process condition of dry cleaning. The dry cleaning rate, that is, the removing rate of the film 34, at the upper part of the process chamber wall 1 can be thus elevated. When these process conditions of dry cleaning are regulated, the removing rate of the film 34 remaining on the process chamber wall 1 can be elevated and the dry cleaning time can be reduced.

Next, when the estimation/diagnosis means 40 judges that dry cleaning should be finished, the process is finished and at the same time, the alarm means can notify the operator of the end of dry cleaning (Step S10). The alarm means may display the end of dry cleaning on the monitor screen of the semiconductor processing apparatus to notify the operator of the end of dry cleaning. When the semiconductor processing apparatus is connected to a computer network, the estimation/diagnosis means 40 may notify the operator or the engineer at a remote place of the end of dry cleaning through the E-mail. These means may be combined with each other, too.

Though this embodiment uses the ultrasonic oscillator 28 as the oscillation means, the oscillation means is not particularly limited. Oscillation is not limited to the sound wave, either, and the sound wave in the audible range may be used, as well. Though this embodiment uses the AE sensor 29 as the reception means, the reception means is not particularly limited. When oscillation means using a low frequency is employed, for example, an acceleration sensor can be used as the reception means. Because propagation of the sound wave oscillation has the properties already described, the user of the invention can select and use an arbitrary frequency suitable for executing the invention.

This embodiment regulates the process condition on the basis of the estimation/diagnosis result during dry cleaning, but this method is not particularly restrictive. The process condition of dry cleaning may be regulated by conducting similar estimation/diagnosis during the execution of the semiconductor process other than dry cleaning such as etching. The process condition of dry cleaning to be carried out next and so on may be regulated on the result of the estimation/diagnosis conducted during dry cleaning.

This embodiment regulates radio frequency power applied to the shower plate 10 or the radio frequency applying electrode 20 as the means for regulating the process condition of dry cleaning, but this method is not particularly restrictive. For example, other process conditions such as the flow rate of the process gas 12 or the internal pressure of the process chamber 3 may be regulated. When the apparatus has temperature regulation means of the process chamber wall 1, this means may be used to regulate the process condition. In the case of an ECR (Electron Cyclotron Resonance) plasma apparatus, a magnetic flux density distribution in the process chamber 3 may be regulated.

Though this embodiment has dealt with the plasma etching apparatus by way of example, the embodiment can be executed for other semiconductor processing apparatuses. When implementing the invention, the user can regulate an arbitrary process condition of dry cleaning on the basis of the result of estimation/diagnosis using the reception signals from the reception means in an arbitrary semiconductor processing apparatus.

As explained above, the invention detects the end point of dry cleaning and regulates the process condition of dry cleaning on the basis of the signals from the reception means, and can achieve an excellent dry cleaning process.

The invention provides a semiconductor processing apparatus capable of diagnosing re-assembly fault of a process chamber after wet cleaning or a condition of the process chamber such as deposition of reaction products and cutoff of components, and a diagnosis method for the semiconductor processing apparatus.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor processing apparatus for applying plasma treatment to a sample arranged in a vacuum process chamber, including plasma generation means for generating plasma inside said vacuum process chamber and process gas introduction means for introducing a process gas into said vacuum process chamber, comprising:

oscillation means for imparting mechanical oscillation to said semiconductor processing apparatus;

reception means for detecting mechanical oscillation generated by said oscillation means in said semiconductor processing apparatus as a signal; and means for analyzing said detected signal to diagnose whether said vacuum process chamber is normally assembled.

2. A semiconductor processing apparatus for applying plasma treatment to a sample arranged in a vacuum process chamber, including plasma generation means for generating plasma inside said vacuum process chamber and process gas introduction means for introducing a process gas into said vacuum process chamber, comprising:

oscillation means for imparting mechanical oscillation to components inside said vacuum process chamber;

reception means for detecting mechanical oscillation generated in said components by said oscillation; and means coupled to said oscillation means and said reception means for determining a resonant frequency of said components by changing the frequency of said imparted mechanical oscillation to diagnose a condition of said components.

3. A semiconductor processing apparatus for imparting plasma treatment to a sample arranged in a vacuum process chamber, including process gas introduction means for introducing a process gas into said vacuum process chamber, comprising:

oscillation means for imparting mechanical oscillation to said semiconductor processing apparatus; and reception means for detecting mechanical oscillation generated by said oscillation means as a signal;

said oscillation means and said reception means being juxtaposed with each other on a sidewall of said vacuum process chamber; and evaluating means for analyzing said detected signal to evaluate the thickness of a film of reacted byproducts deposited to an inner wall of said vacuum process chamber.

* * * * *